(12) United States Patent
Minami et al.

(10) Patent No.: US 7,211,737 B2
(45) Date of Patent: May 1, 2007

(54) INSTALLATION SUBSTRATE, METHOD OF MOUNTING INSTALLATION SUBSTRATE, AND BULB SOCKET USING INSTALLATION SUBSTRATE

(75) Inventors: Fumihiro Minami, Tokyo (JP); Yukari Yamasaki, Tokyo (JP); Mutsuo Sekiya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 717 days.

(21) Appl. No.: 10/110,678

(22) PCT Filed: Aug. 17, 2001

(86) PCT No.: PCT/JP01/07098

§ 371 (c)(1),
(2), (4) Date: Apr. 16, 2002

(87) PCT Pub. No.: WO02/17693

PCT Pub. Date: Feb. 28, 2002

(65) Prior Publication Data

US 2002/0148641 A1 Oct. 17, 2002

(30) Foreign Application Priority Data

Aug. 18, 2000 (JP) ............................. 2000-248161

(51) Int. Cl.
*H01R 12/04* (2006.01)
*H05K 1/16* (2006.01)

(52) U.S. Cl. ...................................... 174/261; 174/260

(58) Field of Classification Search ............ 315/77–80, 315/82; 362/95, 546, 549; 174/250, 255, 174/260, 266, 168.1, 254, 261
See application file for complete search history.

(56) References Cited

U.S. PATENT DOCUMENTS

| 4,238,709 A | * | 12/1980 | Wallace | 315/291 |
| 4,929,872 A | * | 5/1990 | Bridges et al. | 315/209 R |
| 5,532,557 A | * | 7/1996 | Saidian | 315/362 |
| 5,575,557 A | * | 11/1996 | Huang et al. | 362/276 |
| 5,779,458 A | * | 7/1998 | Hong et al. | 417/569 |
| 5,890,912 A | * | 4/1999 | Jenkins | 439/57 |
| 5,918,966 A | * | 7/1999 | Arnold | 362/255 |
| 6,019,642 A | * | 2/2000 | Nagata | 439/683 |
| 6,095,857 A | | 8/2000 | Isac | |
| 6,146,155 A | * | 11/2000 | Boling et al. | 439/79 |

(Continued)

FOREIGN PATENT DOCUMENTS

DE 30007914 A1 9/1981

(Continued)

*Primary Examiner*—Shih-Chao Chen
*Assistant Examiner*—Minh Dieu A
(74) *Attorney, Agent, or Firm*—Sughrue Mion, PLLC

(57) ABSTRACT

A mounting board has a board, retaining members mounted on the upper surface of the board, and a part retained by the retaining members. The part is mounted such that at least a part thereof is arranged below the lower surface of the board, and that the part is electrically connected to the board through the retaining members. Such an arrangement as described above eliminates the need of connecting the discharge gap element to the board by using lead wires, and of mounting it on the upper surface of the board. This lowers the height of the board and admits an elevated part.

28 Claims, 14 Drawing Sheets

U.S. PATENT DOCUMENTS

| | | | |
|---|---|---|---|
| 6,176,706 B1 * | 1/2001 | Maeno et al. | 439/56 |
| 6,309,538 B1 * | 10/2001 | Khan | 210/85 |
| 6,316,935 B1 * | 11/2001 | Vanzuilen | 324/207.21 |
| 6,371,636 B1 * | 4/2002 | Wesson | 362/545 |
| 6,502,956 B1 * | 1/2003 | Wu | 362/237 |
| 2002/0137394 A1 * | 9/2002 | Chung Li | 439/647 |
| 2003/0184242 A1 * | 10/2003 | Denes | 315/291 |

FOREIGN PATENT DOCUMENTS

| | | |
|---|---|---|
| DE | 8711882 U1 | 2/1987 |
| DE | 4419667 C2 | 5/1996 |
| DE | 19539176 A1 | 6/1996 |
| DE | 19913942 C1 | 4/2000 |
| EP | 0018067 A1 | 10/1980 |
| EP | 0863518 A1 | 9/1998 |
| JP | 62-134224 U | 8/1987 |
| JP | 03-136938 | 6/1991 |
| JP | 05-082933 | 4/1993 |

* cited by examiner (a)

(b)

(a)

(b)

INSTALLATION SUBSTRATE, METHOD OF MOUNTING INSTALLATION SUBSTRATE, AND BULB SOCKET USING INSTALLATION SUBSTRATE

TECHNICAL FIELD

This application is a 371 of PCT/JP01/07098 Aug. 17 2001.

This invention relates to a mounting board for mounting thereon a part or parts, a method of mounting the mounting board, as well as to a bulb socket using the mounting board.

BACKGROUND ART

Conventionally, as a part to be mounted on a board, there has been used one as shown in FIG. 1 (here, as an example, a discharge gap element is given).

Referring to FIG. 1, reference numeral 12 denotes a board, reference numerals 12a and 12b mounting holes on the board 12. Reference numeral 15 denotes a discharge gap element, and reference numerals 15a, 15b leads projected from the side of an electrode on both ends of the discharge gap element 15. The discharge gap element 15 is mounted on the board 12 by inserting these leads 15a, 15b into the inserting holes 12a, 12b on the board 12 and then by soldering them.

As an example of a mounted part other than the discharge gap element, JP 82933/1993 A disclosed one in which a sub-board is mounted on the upper surface of a mounting board and a leadless part is soldered onto this sub-board.

Since this conventional discharge gap element is mounted into the mounting holes on the board as shown in FIG. 1, it is mounted on the upper part of the board and the height of the board after mounting obtained by an equation (the thickness of the board itself+the height of the discharge gap element element). In order to hold down the height of the board, there has no other choice but to lower the height of the discharge gap element. The same holds true for the other parts to be mounted on the board, as they are mounted on the upper part of the board, there has no other way than to lower the height of the part in order to hold down the height of the board.

In addition, the conventional discharge gap element was permitted to arrange only in the neighborhood of the mounting holes on the board and to have a lower freedom of arrangement thereof. For this reason, in case of trying to hold down the height of a specific portion of the board after parts have been mounted thereon, if the necessity arises to move the position of the discharge gap element on the board, much time requires for redesign of the circuit pattern.

Further, the discharge gap element has conventionally been used in a lighting device for a discharge lamp of a motor vehicle, or the like.

First, the conventional discharge lamp will be described.

Among the discharge lamps, a high intensity discharge (HID) lamp such as a metal halide lamp, a high-pressure sodium vapor lamp, a mercury lamp, or the like, has advantages that it has large luminous flux, high lamp efficiency, and long lifetime. Therefore, it has been used as an illumination lamp in indoor and outdoor facilities, warehouses, factories, or the like, or as a street lamp, or the like. Recently, it is being used particularly as a headlamp for a vehicle such as a motor vehicle. In order to light this kind of discharge lamp, it is necessary to apply a high starting voltage at the time of starting. In addition to a stabilizer to stably light the discharge lamp, a starting device (an ignitor) to generate the starting voltage, including parts called as a transformer, a capacitor, a discharge gap element, or the like, is required.

FIG. 2 is a longitudinal sectional view of the lighting device as seen from the vehicle explaining a conventional lighting device for the HID headlamp of a motor vehicle.

Inside a housing 1 a reflector 2 is attached which acts as a reflecting mirror to converge an optical axis, and on an inner surface of which a reflecting surface is coated. An HID bulb 4 held by a bulb socket 3 is mounted substantially in the center of the reflector 2. An ignitor 5 for generating a high voltage, e.g., of 30 KV in order to light the HID bulb 4 is disposed separate from the HID lighting fixture. A power control circuit (ballast) 7 for lighting the HID lighting device is disposed integrally with, or separate from, the ignitor 5 or a transformer 6. The HID lighting device configured in this manner instantaneously applies a high voltage to the HID bulb 4 to induce the high-voltage discharge of the HID bulb, whereby the gas filled inside the bulb gives rise to discharge to light it. Reference numeral 8 denotes a lens and the luminous flux of the HID bulb is dispersed within a predetermined range through the lens 8 to illuminate the ahead of the vehicle, thereby securing the safety of the vehicle when running in the dark.

This kind of HID headlamp is mounted in a space between a bumper 9 and an engine hood 10. In the primitive HID lighting device, the ignitor 5 for generating the high voltage and the control circuit (ballast) 7 for supplying electricity to the HID lighting device are mounted separate from the lighting fixture, and the power is supplied to the bulb socket 3 through a harness 11.

In this kind of structure, since the ignitor 5 and the bulb socket 3 are disposed separate from each other and they are connected through the harness 11, it was compelled to cover the harness 11 with a high-performance electromagnetic shielding wire in order to shield the electric waves to be leaked out from the harness 11. However, complete removing of the effect on a car radio or the like was ended in failure.

In order to solve this problem, the best way is to incorporate the high-voltage module inside the lighting fixture and also to shield the inside of the lighting fixture from the electromagnetic waves by means of metallic thin film deposition or the like. As one approach, it is devised that the ignitor 5 for generating the high voltage is integrally mounted with the HID bulb.

One such example will be described with reference to FIG. 3.

As shown in FIG. 3, it has conventionally been known (e.g., in JP 136938/1991 A) to annex the ignitor 5 on a board on which the HID bulb 4 is mounted, and to house them inside the lighting fixture.

Referring to FIG. 3, reference numeral 12 denotes the board which is attached to the reflector 2 and onto which the HID bulb 4 is assembled, reference numeral 13 a transformer around which a primary coil and a secondary coil are wound to generate the starting voltage for the HID bulb, reference numeral 14 a charging capacitor therein the starting energy, reference numeral 15 a discharge gap element. Through a potential difference charged in the capacitor 14 on both ends of the discharge gap element 15, the gas filled inside the part quickly starts electric discharge due to dielectric breakdown, which supplies electricity to the primary coil of the transformer 13. This generates a high-voltage pulse of 20 KV through 30 KV in the secondary coil of the transformer 13, whereby the HID bulb 4 is illuminated by discharge. Reference numeral 16 denotes a cap.

Typically, a starting device 300 of the HID lighting device is made up of the transformer 12, the capacitor 14, the discharging gap 15, or the like. The one described with reference to FIG. 3 houses the starting device 300 inside the lighting fixture. In order to prevent the electric noises from being leaked out, the inner wall surface of the housing 1 is provided with a coating of a metallic thin film for shielding purpose, and the body of the housing 1 is grounded.

As a discharging gap 15, the same one is used as that described with reference to FIG. 1.

However, such the arrangement as shown in FIG. 3 encumbers miniaturization, in particular, thickening of the starting device 300, as the starting device 300 is housed inside the lighting fixture. It is therefore infeasible to miniaturize the lighting fixture and to attain a space efficiency inside the vehicle. Further, soldering after the leads 15a, 15b extended from both electrodes of the discharge gap element 15 have been inserted into the board requires the cutting work for excess leads protruded from the back of the board. In addition, the discharge gap element 15 bent at the lead wires interferes with other parts on the board.

Further, as described above, the parts such as the conventional discharge gap element, or the like, are mounted on the upper part, of the board, when they are mounted on the mounting board. Therefore, in order to hold down the height of the board, there has no other way than to lower the height of the parts.

Still further, in the mounting board on which the parts such as the conventional discharge gap element, or the like are mounted, the parts were allowed to arrange only in the vicinity of the mounting holes on the board and to have a lower freedom of arrangement. Therefore, in case of trying to lower the height of a particular portion of the board after parts have been mounted thereon, if the necessity arises to move the position of the discharge gap element on the board, much labor costs for redesign of the circuit pattern.

This invention has been made to solve the above and other problems and an object thereof is to provide a mounting board suitable for miniaturization of the apparatus as well for mass production, a board for mounting thereon a part, a method of mounting the mounting board, as well as a bulb socket using the mounting board.

DISCLOSURE OF INVENTION

In a mounting board of the invention including a board; a retaining member mounted on the upper surface of the board; a part retained by the retaining member, at least a part of the part is arranged below the lower surface of the board, and the part is electrically connected to the board through the retaining member. This enables mounting of the part without a lead wire, and gives higher freedom of arrangement of the part. Further, this becomes possible to mount the part, e.g., on the side of the board. In addition, it requires no much time for removing the excess lead wires after soldering has been finished, and prevents the part from falling down as a result of bending of the lead wires.

Since the retaining member preferably includes a holder mounted on the board; and a retaining part projected laterally from the holder to retain the part, it is possible to mount the part on the side of the board, thereby lowering the height of the mounting board.

Further, since the retaining member is preferably held by a waste board, the retaining member is provisionally held by the waste board until the retaining member is fixed, thereby preventing the retaining member from dislocating from the mounted position. In addition, since the waste board is removed from the board, after the retaining board is fixed by soldering, or the like, the waste board is effectively utilized. Further, since the waste board is removed from the board, it is possible to make the board smaller in size as compared with a case in which the retaining member is provisionally fixed by using the board or other parts. Still further, it becomes possible to mount the part retained by the retaining member on the side of the board.

In addition, since in the mounting board including a retaining member mounted on a board; and a leadless discharge gap element retained by the retaining member, the discharge gap element is arranged below the lower surface of the board, and the discharge gap element is electrically connected to the board through the retaining member, it is possible to lower the height of the mounting board. Further, since the leadless discharge gap element is used, time is saved for removing the excess lead wires after the soldering has been finished. Still further, the part is prevented from falling down as a result of bending of the lead wires.

Since the method of mounting on a mounting board of the invention includes the steps of retaining a retaining member which retains a part by a board and a waste board; retaining the part by the retaining member; fixing the retaining member on the board; and removing the waste board from the board after the retaining member has been fixed to the board, the retaining member is held by the waste board until the retaining member is fixed. Taking advantage of the retaining member ensures the holding until the retaining member is fixed.

Further, since the step of fixing the retaining member on the board preferably is a step of soldering the retaining member to the board and the part to the retaining member, the waste board is removed after the holding device and the part have been fixed. This ensures the holding until the part is fixed.

Since in the bulb socket using a mounting board of the invention includes a high-voltage terminal connected to a high-voltage plug of a lamp; a low-voltage terminal connected to a low-voltage plug of the lamp; a high-voltage generating circuit for applying a high voltage to the high-voltage plug; a discharge gap element configuring the high-voltage generating circuit; a retaining member for retaining the discharge gap element; a board for mounting thereon the retaining member, the leadless discharge gap element is used, and the discharge gap element is retained by the retaining member to connect it to the board, higher freedom is given to mount the discharge gap element and the mounting board inside the bulb socket. This effectively utilizes the space inside the bulb socket. Further, since the leadless discharge gap element is used, time is saved for removing the excess lead wires after soldering has been finished and further the part is prevented from falling down as a result of bending of the lead wires.

Since the discharge gap element is preferably mounted on the side of the board, the height of the mounting board having mounted thereon the discharge gap element is lowered, and the bulb socket is made small. This gives higher freedom of mounting of the mounting board inside the bulb socket.

In the bulb socket using a mounting board including a high-voltage terminal connected to a high-voltage plug of a lamp; a low-voltage terminal connected to a low-voltage plug of the lamp; a high-voltage generating circuit for applying a high voltage to the high-voltage plug of the lamp; a discharge gap element configuring the high-voltage generating circuit; a retaining member for retaining the discharge gap element; a board for mounting thereon the retaining member, the discharge gap element is retained by the retaining member such that at least a part of the discharge gap element is arranged below the board. This lowers the height of the mounting board on which the discharge gap element has been mounted, miniaturizes the bulb socket, and gives higher freedom of mounting the mounting board inside the bulb socket. In addition, when soldering with a solder-flow bath or the like, it makes possible to simultaneously solder the discharge gap element to the retaining member, resulting in an improved working efficiency.

Further, since the retaining member is provisionally held by a waste board of the board, the retaining member is provisionally held by the waste board until the retaining member is fixed. Effective utilization of the waste board ensures the provisional holding until the retaining member is fixed.

A concavity or a convexity is further preferably provided in that position where it comes into contact with the discharge gap element of the retaining member. The discharge gap element is surely held by fitting the discharge gap element into the concavity or urging it by the convexity.

Further, the board is preferably subjected to a solder-flow processing, with the retaining member retained by the board and the waste board, and the discharge gap element retained by the retaining member. This fixes the discharge gap element on the retaining member at the time the board is solder-flow processed.

Still further, low-voltage ends of a primary coil and a secondary coil are preferably twisted and connected by the retaining member. Therefore, this makes it possible for the retaining member to serve the dual purposes of twist and connection of the primary coil and the secondary coil to the low-voltage ends, as well as of holding the discharge gap element, thereby miniaturizing the mounting board.

BEST MODE FOR CARRYING OUT THE INVENTION

In order to describe this invention in more detail, the best mode for carrying out this invention will be described with reference to the accompanying drawings.

First Embodiment

Figure 1:
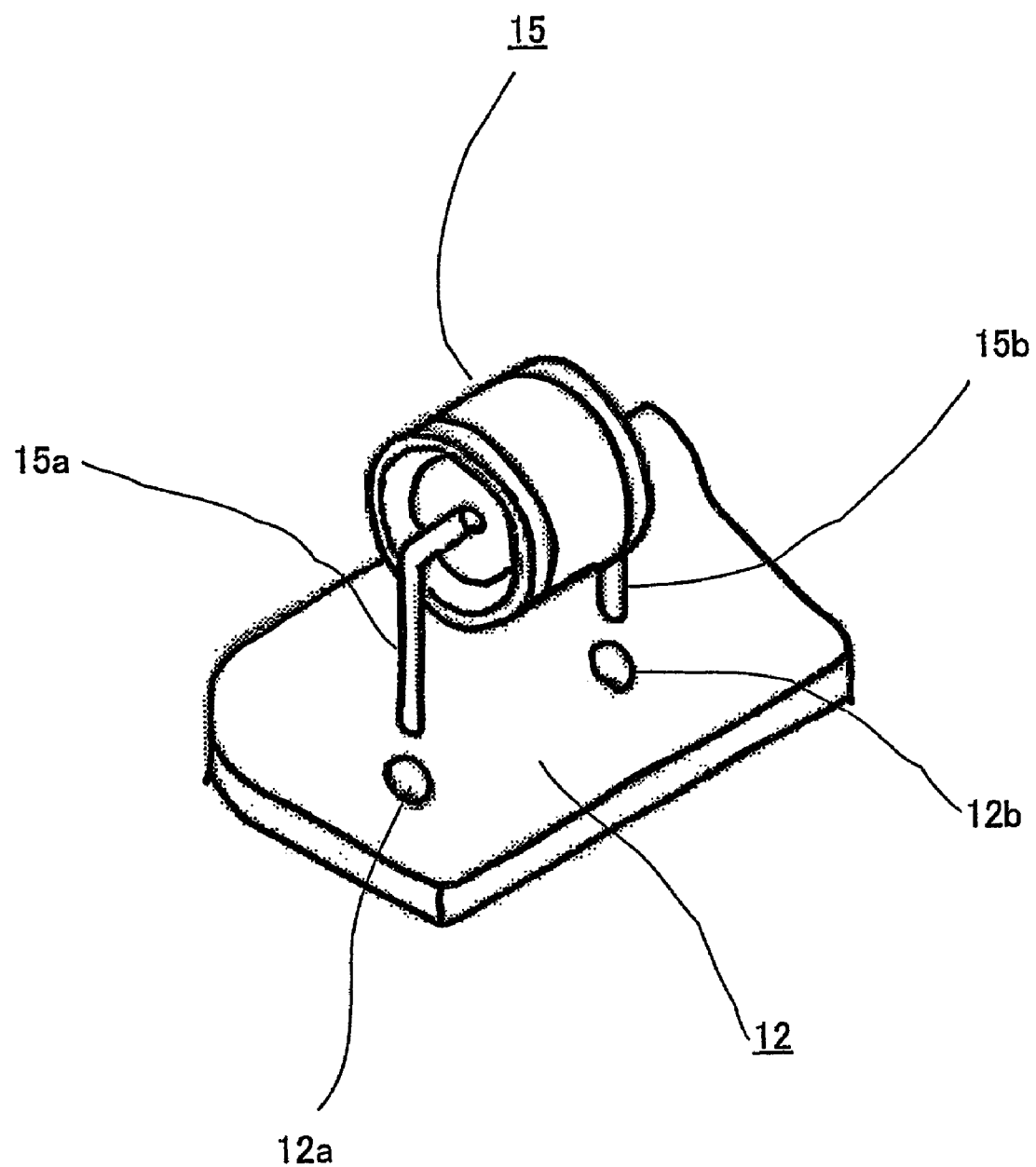
FIG. 1 is a perspective view showing a state in which a discharge gap element of a conventional HID lighting device is mounted, housed a starting circuit part inside a lighting fixture.
Figure 2:
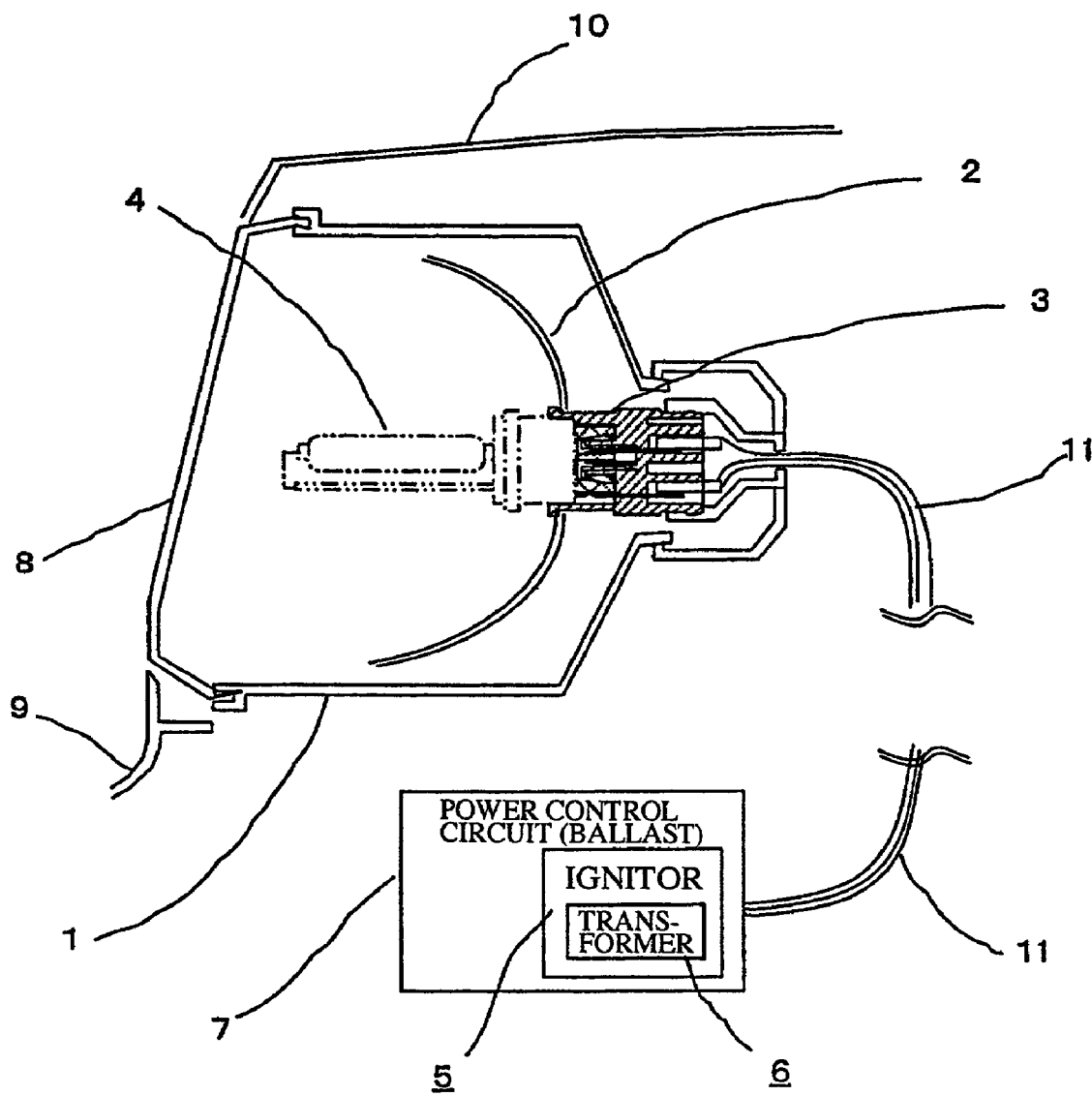
FIG. 2 is a sectional view explaining a state in which the conventional HID lighting device is mounted on a vehicle.
Figure 3:
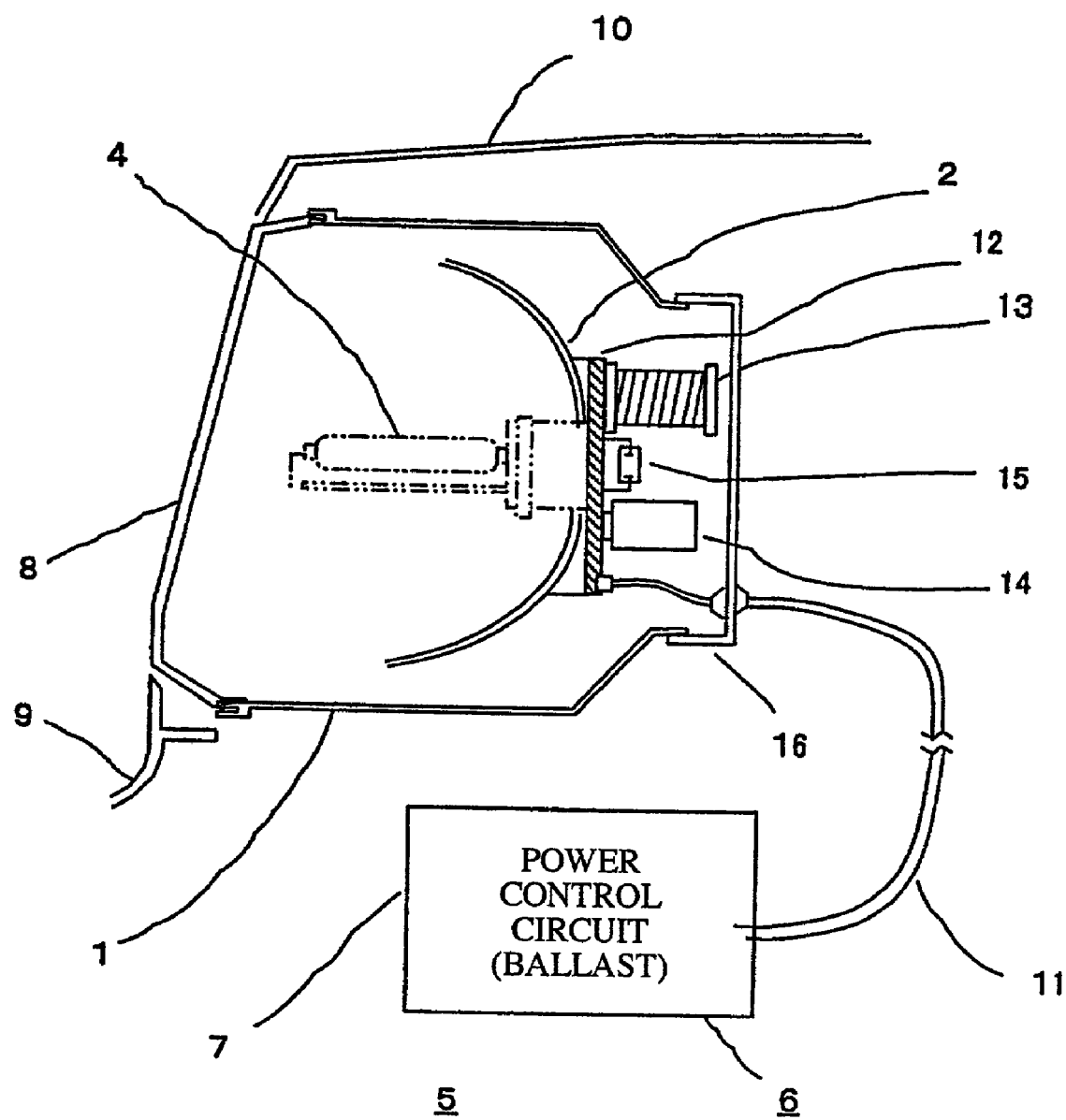
FIG. 3 is a sectional view explaining a state in which a discharge gap element of a conventional HID lighting device is mounted, housed a starting circuit part inside a lighting fixture.
Figure 4:
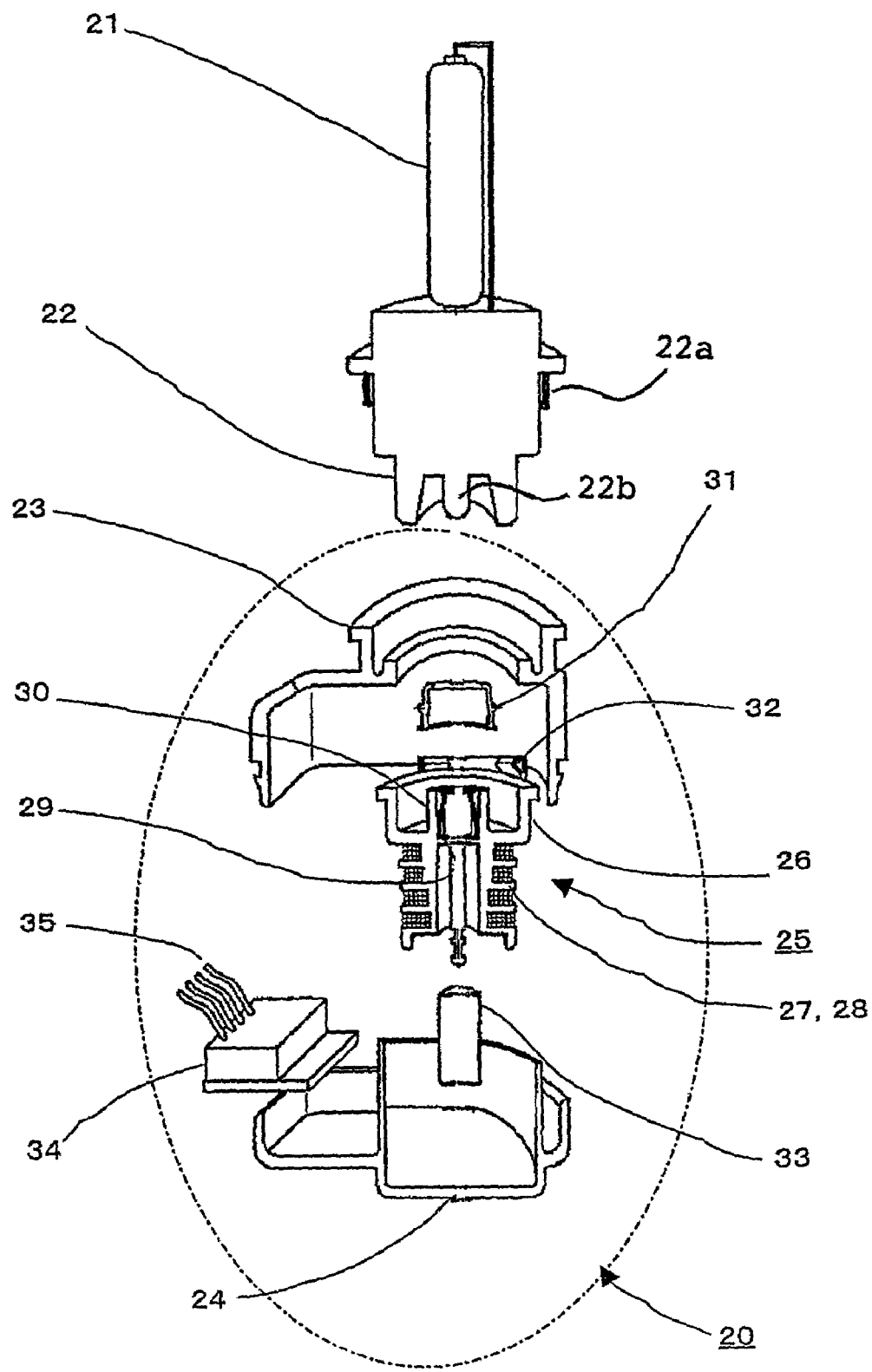
FIG. 4 is a sectional perspective view showing the components of an ignitor-integrated type socket in a first embodiment of the invention.
Figure 5:
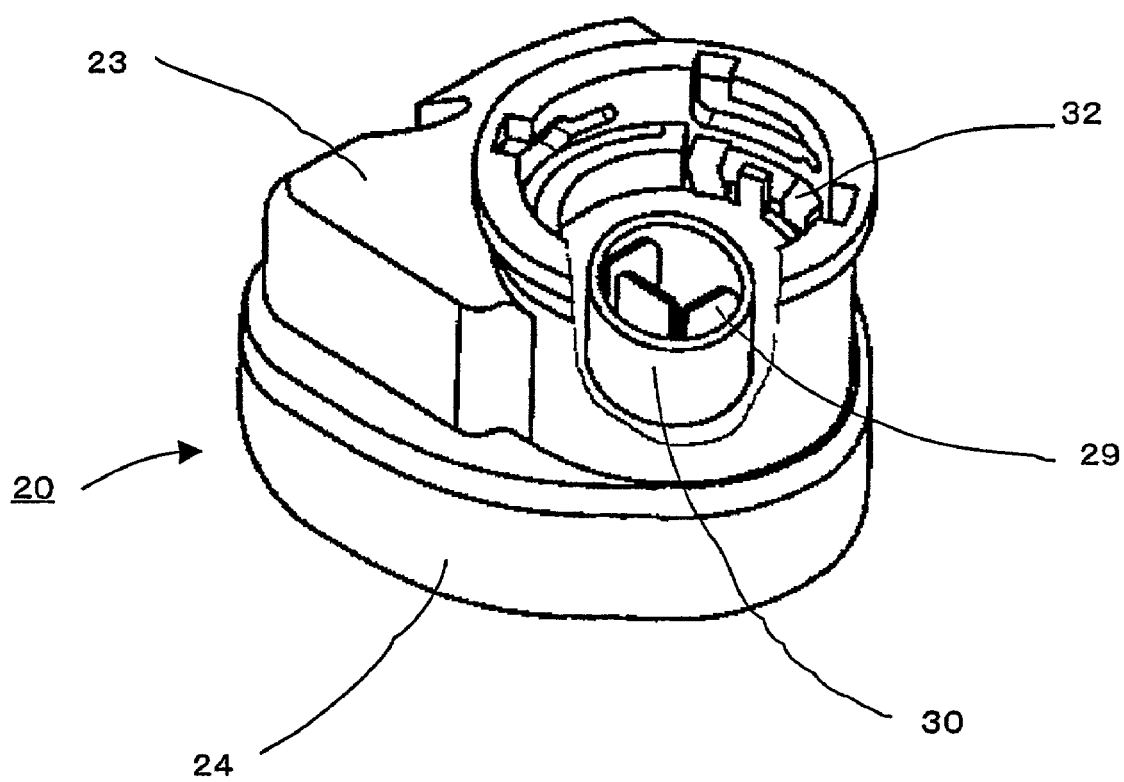
FIG. 5 is a perspective view showing an external view of an ignitor-integrated type socket in a first embodiment.

FIG. 4 is a sectional perspective view explaining the ignitor-integrated type bulb socket of the first embodiment of the invention, and FIG. 5 is an external view thereof.

Referring to FIGS. 4 and 5, reference numeral 21 denotes an HID bulb, reference numeral 22 an HID plug as an electrode of the HID bulb, and reference numerals 22a and 22b a low-voltage plug and a high-voltage plug, respectively. Reference numeral 20 denotes an ignitor-integrated type bulb socket containing therein a starting device for lighting the HID bulb, reference numeral 23 the upper cover of the bulb socket, and reference numeral 24 the lower cover thereof.

Reference numeral 25 denotes a boosting transformer for generating a high voltage of 20 KV or more at the time of starting the HID lighting device. Reference numeral 26 denotes a bobbin, reference numerals 27, 28 a primary coil and a secondary coil, respectively, to be wound around the bobbin 26, reference numeral 29 a high-voltage terminal which is connected to the high-voltage of the primary coil and comes into contact with the high-voltage bulb plug 22b at the time of mounting the HID bulb 21, reference numeral 30 a guide which is disposed on the peripheral of the high-voltage terminal 29 and is integrally formed with the bobbin 26, reference numeral 31 an insulating member which is inserted into an outer wall side of the guide 30 and electrically insulates between the high-voltage and the low-voltage, reference numeral 32 a low-voltage terminal which comes into contact with the low-voltage plug 22a of the HID bulb 21, and reference numeral 33 a core which forms the center of the transformer and comes into contact with the high-voltage terminal 29.

Reference numeral 34 denotes electronic parts which form the starting circuit inclusive of a purview of the invention and reference 35 a harness thereof.

Figure 6:
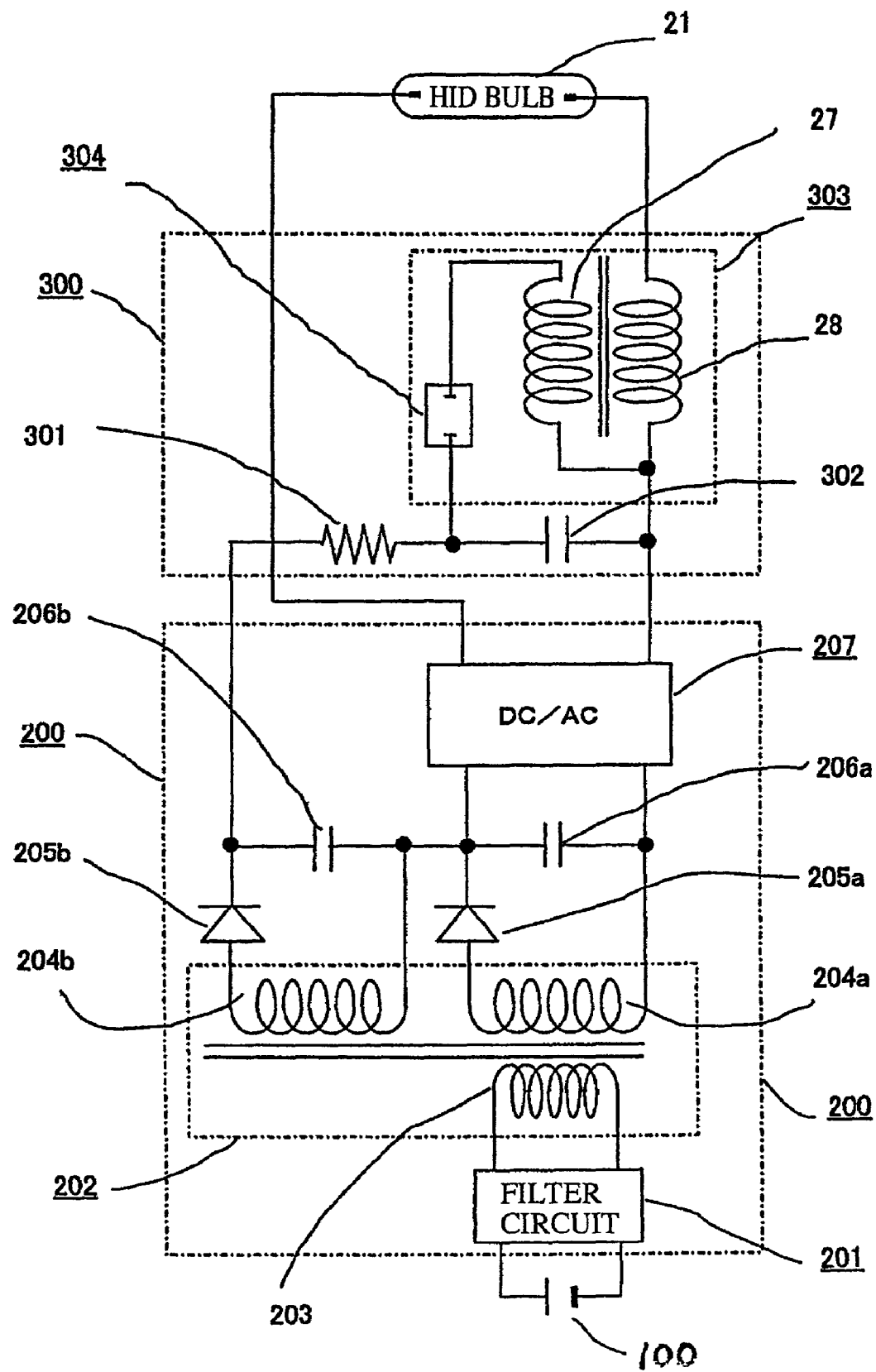
FIG. 6 is a basic circuit configuration of an ignitor-integrated type socket in a first embodiment.

FIG. 6 shows a basic circuit configuration of the HID discharge bulb.

Referring to FIG. 6, reference numeral 100 denotes a main battery of the motor vehicle and is ordinarily 12 V for motor vehicles and 24 V for trucks. Reference numeral 200 denotes a power control circuit of the HID bulb 21 which is usually called as a ballast. Reference numeral 201 denotes a filter, reference numeral 202 a power transformer, reference numeral 203 a primary winding of the power transformer 202, reference numeral 204a a first secondary winding, reference numeral 204b a second secondary winding, reference numerals 205a and 205b a first diode and a second diode, respectively, and reference numerals 206a and 206b a first capacitor and a second capacitor, respectively. In this case, the first and second secondary coils are connected in series. Reference numeral 207 denotes a DC/AC converter for converting a direct current of the battery 100 into an alternating current.

Reference numeral 300 denotes a starting circuit which generates a high voltage for lighting the HID bulb 21 and is usually called as an ignitor. Reference numeral 301 denotes a resistor having a predetermined resistance, reference numeral 302 a charging capacitor, reference numeral 303 a high-voltage transformer for generating a high voltage required to light the HID bulb, reference numeral 27 a primary winding of the high-voltage transformer 303, reference numeral 28 a secondary winding of the high-voltage transformer 303, reference numeral 304 a discharge gap element which brings it to a current-carrying state through a dielectric breakdown of the insulating gas sealed inside the part when a given potential difference is yielded across the electrodes by charging the capacitor 302 with a given value or more. The secondary winding 28 of the high-voltage transformer 303 is connected to the high-voltage plug 22b.

Taking the above circuit configuration, when the HID bulb 21 is lighted, a high voltage of about 20 KV is applied to the HID bulb 21 by the starting circuit 300. When an initial discharge has occurred as a result of inducement of the gas discharge inside the HID bulb 21, an alternating current of 400 Hz is stabaly applied by the power control circuit 200, thereby keeping the HID bulb 21 lightning.

Figure 7:
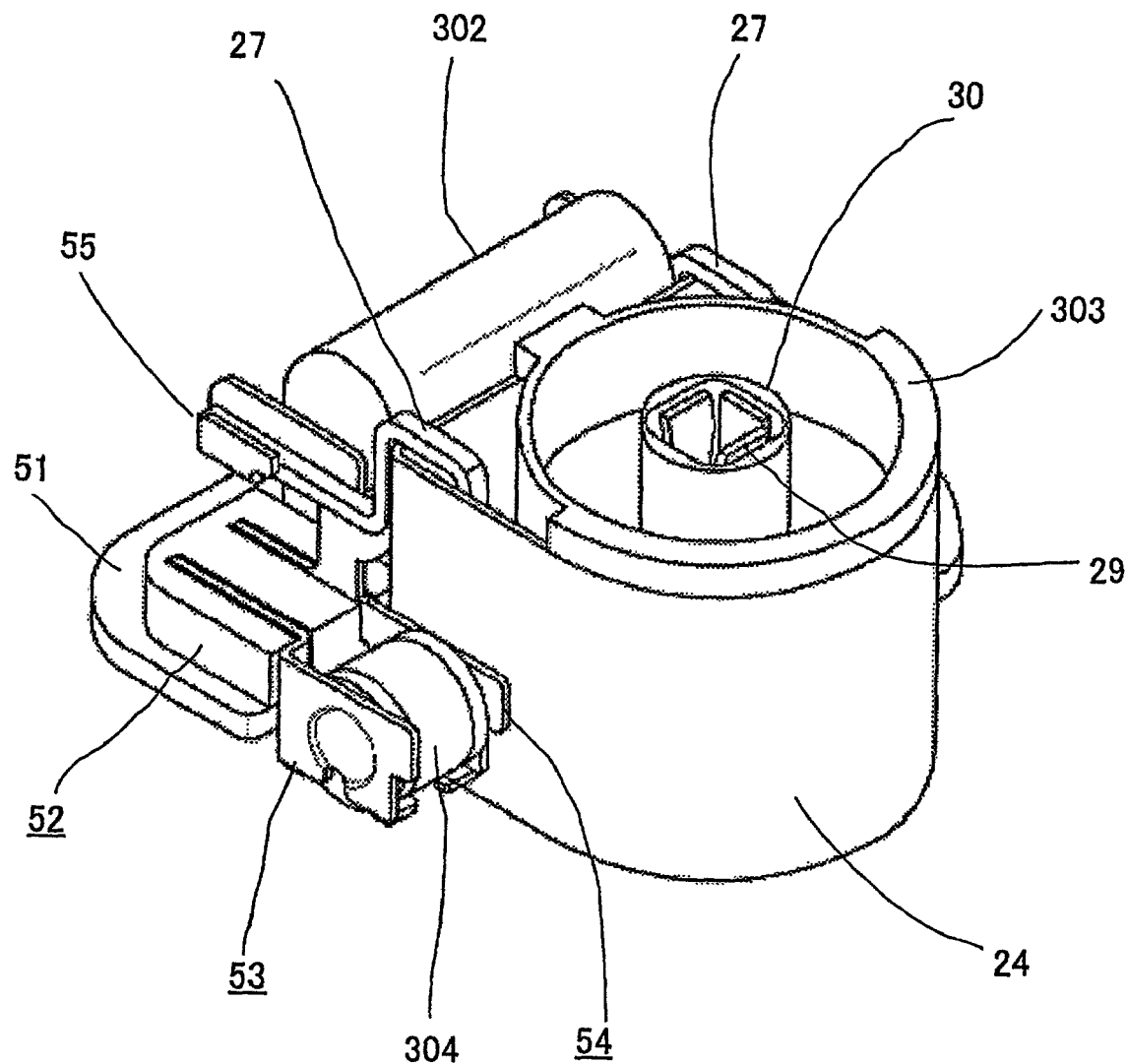
FIG. 7 is a perspective view showing a state in which the upper case of an ignitor-integrated type socket is mounted in a first embodiment.
Figure 8:
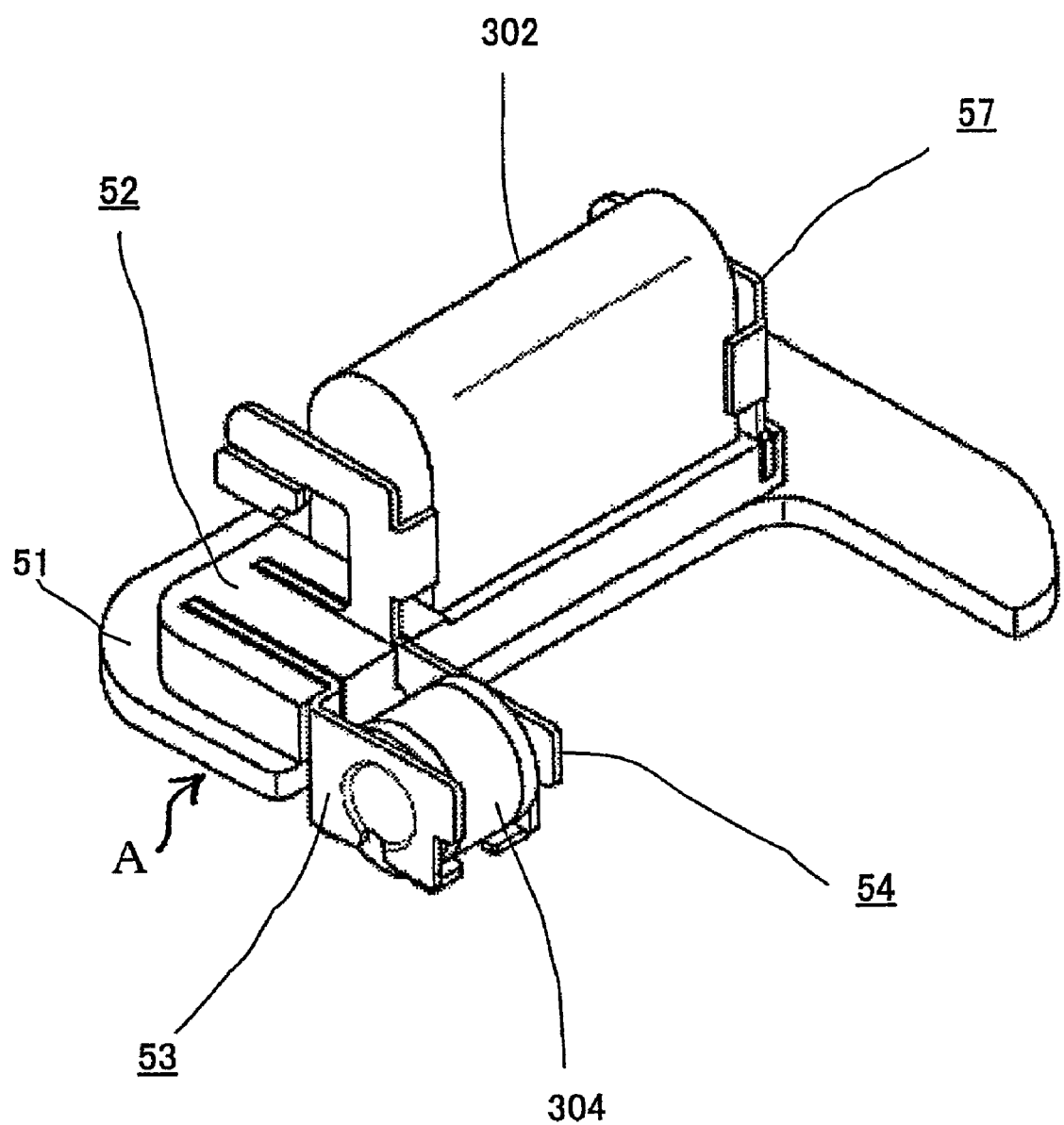
FIG. 8 is a perspective view showing a state in which starting circuit components of an ignitor-integrated type socket are mounted in a first embodiment.

Next, with reference to FIGS. 7 and 8, the circuit components arrangement of the ignitor-integrated type socket contained therein the starting circuit 300 will be described. FIG. 7 is a perspective view showing a state in which the upper cover 23 of the ignitor-integrated type socket has been removed. FIG. 8 is a perspective view showing a state in which only the parts configuring the starting circuit 300 have been picked up.

Referring to FIGS. 7, 8, reference numeral 51 denotes a board, reference numeral 52 a resin holder which is installed on the board, reference numeral 53 a sheet metal-made retaining member which is inserted into one of grooves in the resin holder 52 and protruded laterally from the board 51, reference numeral 54 a sheet metal-made retaining member which is similarly inserted into the other grooves in the resin holder 52 and protruded laterally from the board 51, reference numeral 304 a discharge gap element which is tightly held between the above one sheet metal-made retaining member 53 and the other sheet metal-made retaining member 54, reference numeral 55 a coil connecting part which is disposed in a part of the other retaining member and has a groove around which the distal ends of the primary coil and the secondary coil 27, 28 of the transformer 303 are wound to fix them by soldering, and reference numeral 302 the capacitor.

Figure 9:
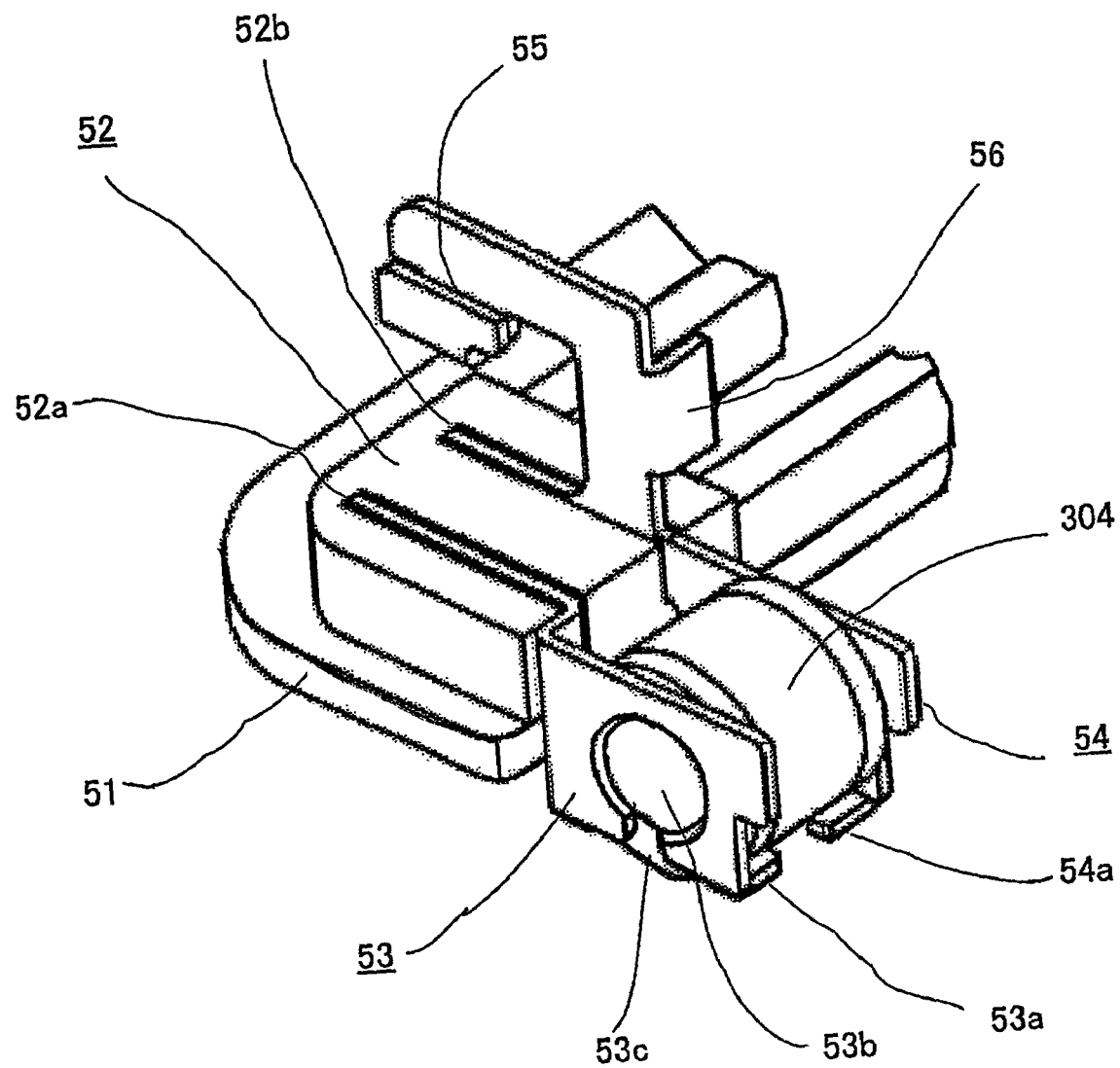
FIG. 9 is a perspective view showing a state in which the discharge gap element of an ignitor-integrated type socket is held in a first embodiment.

FIG. 9 is an enlarged view showing part A in FIG. 8.

Referring to FIG. 9, reference numeral 51 denotes the board, reference numeral 52 the resin holder, reference numerals 53 and 54 the sheet metal-made retaining members, reference numeral 304 the discharge gap element, reference numerals 52a, 52b grooves which are formed in the resin holder 52 and into which the pair of sheet metal-made retaining members 53, 54 are inserted and assembled, reference numerals 53a and 54a claws which are provided pair by pair at the lowermost portions of the sheet metal-made retaining members 53, 54 and hold the discharge gap element 304, reference numerals 53b and 54b convexities projected in the contacting direction with the electrodes of the discharge gap element 304, reference numerals 53c and 54c notched portions which are formed in the sheet metal-made retaining members 53 and 54 by cutting away a part of the sheet metal-made retaining members below the bottom of the each convexity, and reference numeral 55 a groove which is formed in a part of the sheet metal-made retaining member 54 and around which the distal ends of the primary coil and the secondary coil are wound respectively for pouring solder into the groove. Reference numeral 56 denotes a bent portion for preventing the inclination. In case the whole board is pulled up and inclined due to the coil tension at the time of winding the primary coil and the secondary coil around the groove 55, the bent portion 56 comes into contact with the wall surface of the lower case 24 as shown in FIG. 7 for preventing further inclination.

Figure 10:
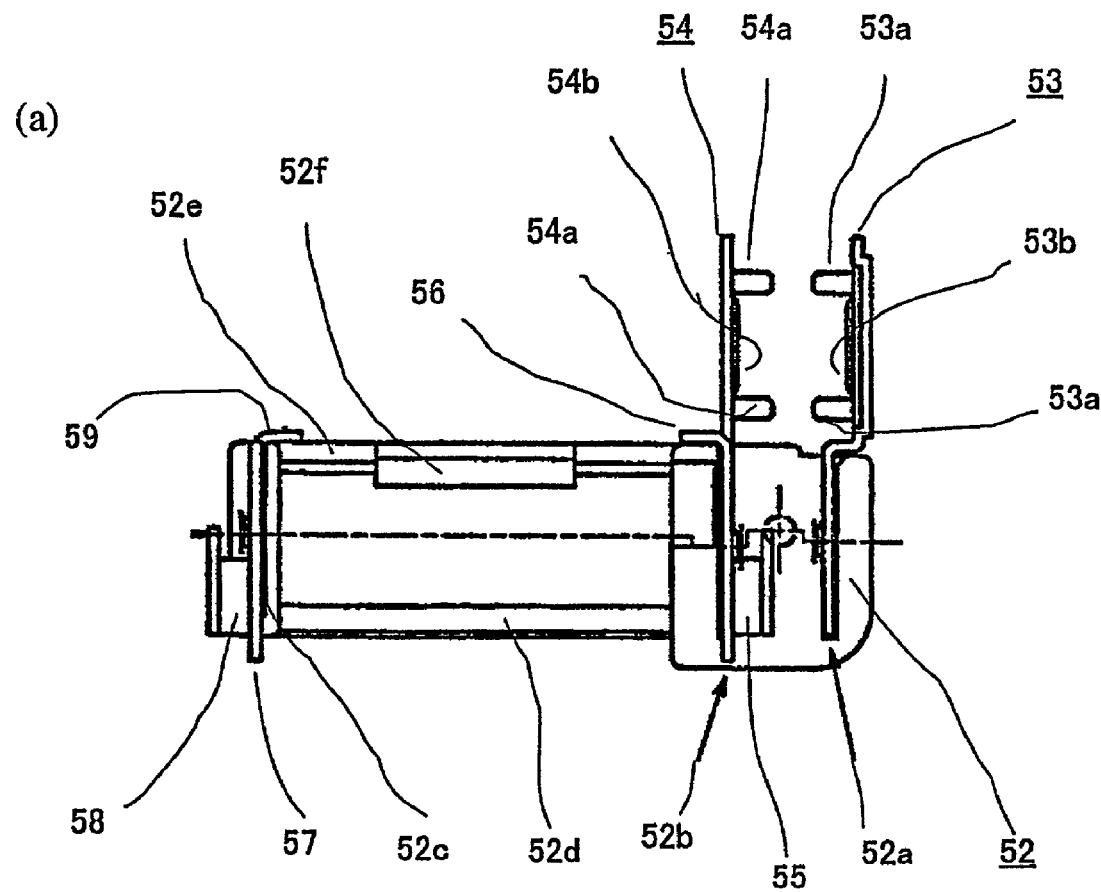
FIG. 10 is a plan view showing a state in which the sheet metal-made retaining members are mounted on a resin holder of an ignitor-integrated type socket in a first embodiment.
Figure 10:
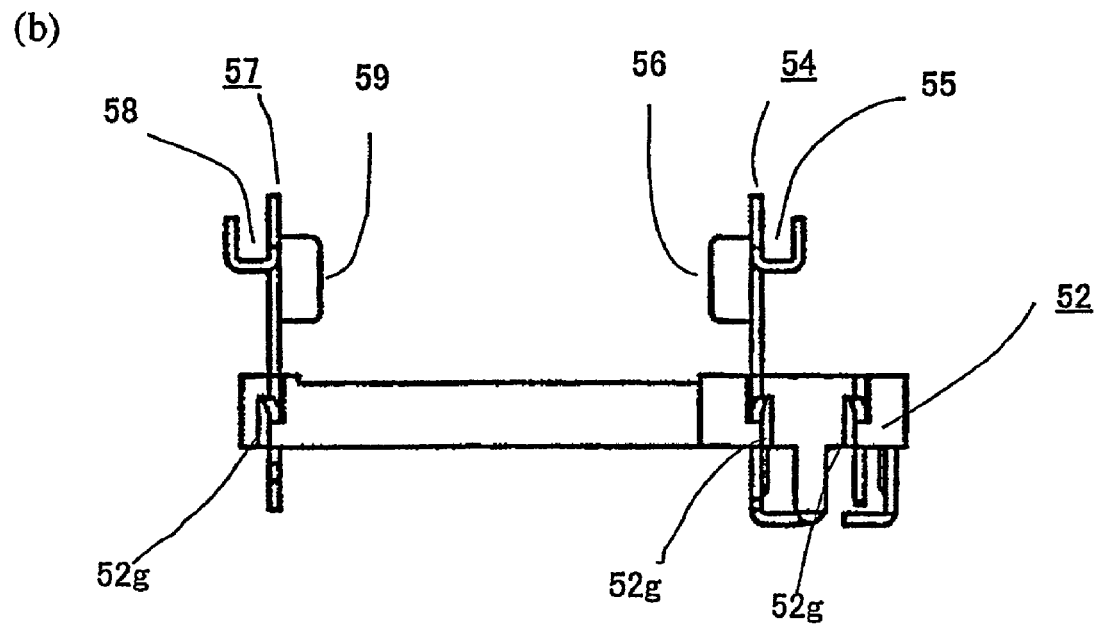

FIG. 10 shows a state in which a pair of sheet metal-made retaining members 53 and 54 as well as another sheet metal-made retaining member 57 are mounted on the resin holder 52. FIG. 10A is a plan view and FIG. 10B is a front view.

Referring to FIGS. 10A, 10B, reference numerals 52a, 52b and 52c denote grooves for inserting and assembling the sheet metal-made retaining members, respectively. The grooves 52d and 52e adopted a beam structure, respectively, and the space between these two facing members is used for holding therein the capacitor 302. In order for the capacitor 302 of oval-shaped cross section to be less likely to fall down when the capacitor 302 is mounted into this space, there is provided in either of the beams a supporter 52f which conforms with the oval shape of the capacitor 302.

The other sheet metal-made retaining member 57 also has a groove 58 formed by bending for winding therearound the distal end of the primary coil and for pouring solder thereinto, as well as an inclination preventing bent portion 59.

Figure 11:
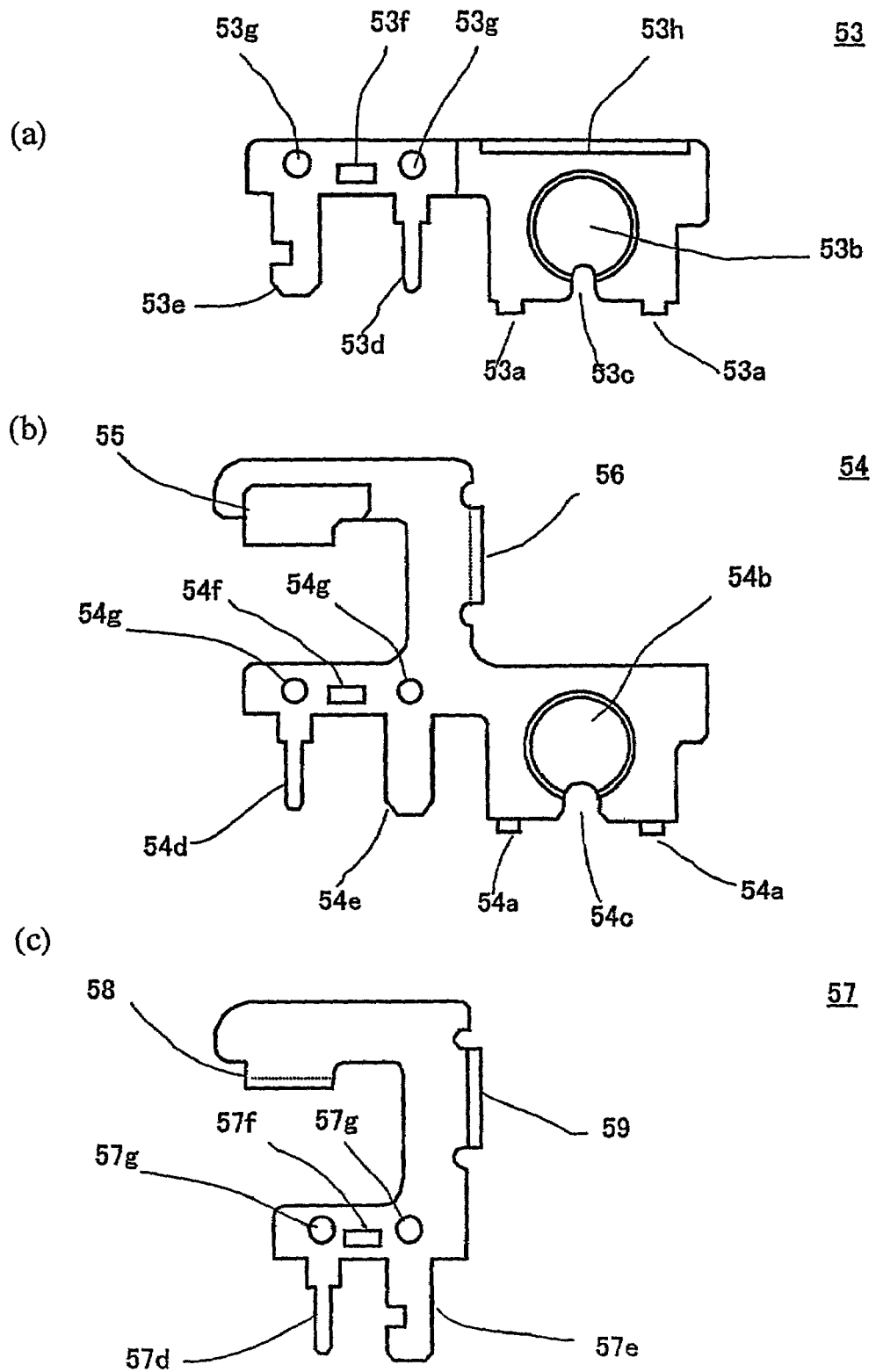
FIG. 11 is a side view showing a shape of the sheet metal-made retaining members of an ignitor-integrated type socket in a first embodiment.

FIG. 11 shows the shape of the sheet metal-made retaining members 53 and 54, and the other sheet metal-made retaining member 57.

FIG. 11A shows the side profile of the sheet metal-made retaining member 53 on one side of the pair of sheet metal-made retaining members.

Referring to FIG. 11A, Reference numeral 53a denotes a claw, reference numeral 53b a convexity, reference numeral 53c a notched portion, reference numerals 53d and 53e a leg respectively connected to the board, and reference numerals 53g and 53f an embossed portion, respectively.

In FIG. 11A, the circular embossed portion 53g formed in two places are formed in order to stabilize the position of the sheet metal-made retaining member 53 by urging it against the side surface of a wall of the groove when the sheet metal-made retaining member 53 is inserted into the groove 52a of the resin holder 52. Both members are projected in the same direction.

In FIG. 11A, the square embossed portion 53f formed between the circular embossed portions 53g has a pull-out arresting function to be less likely to pull out by engaging with the hole 52g which is carved from the back of the resin holder 52, once the sheet metal-made retaining member 53 has been inserted into the resin holder 52. The square embossed portion 53f projects in a tapered manner relative to the inserting direction. The square embossed portion 53f is projected in the direction opposite to that of the circular embossed portion 53g. It is thus so arranged that, even if the width of the groove 52a in the resin holder is slightly larger compared with the plate thickness of the sheet metal-made retaining member 53, the provision of the embossed portions 53g and 53f surely prevents the sheet metal-made retaining member 53 from being pulling out.

Further, reference numeral 53h denotes a chamfered portion. The corner positioned above the convexity 53b for holding the discharge gap element 304 is chamfered in the direction opposite to that of the convexity 53b so as to prevent the discharge gap element 304 from getting caught at the time of assembling thereof, thereby improving assembly work.

FIG. 11B shows a side profile of the sheet metal-made retaining member 54 on the other side of the pair of the sheet metal-made retaining members.

Referring to FIG. 11B, reference numeral 54a denotes a claw, reference numeral 54b a convexity, reference numeral 54c a notched portion, reference numerals 54d and 54e a leg respectively connected to the board, reference numerals 54g and 54f punched portions which are different in shape from each other, reference numeral 55 a groove formed by bending, and reference numeral 56 a bent portion for preventing the falling down. The functional description of the respective portions is basically the same as that made with reference to FIG. 11A, and a description thereof is therefore omitted for brevity's sake.

FIG. 11C shows a side profile of the other sheet metal-made retaining member 57.

Referring to FIG. 11C, reference numeral 57d and 57e denote a leg respectively connected to the board, reference numerals 57g and 57f embossed portions which are different in shape from each other, reference numeral 58 a groove formed by bending, and reference numeral 59 a bent portion for preventing the falling down. The functional description of the respective portions is basically the same as that made with reference to FIG. 11A and a description thereof is therefore omitted for brevity's sake. Preferably, a chamfered portion which is equivalent to the chamfered portion 53h formed in the sheet metal-made retaining member 53 on one side of the pair of sheet metal-made retaining members should also be formed in the sheet metal-made retaining member 54 on the other side.

The legs 53e and 57e shown in FIGS. 11A and 11C respectively has a notched portion in a respective front end. These legs 53e and 57e are provided to fix the both portions by clinching (twisting) the front ends ahead of the notched portions of the legs 53e and 57e after the resin holder 52 into which the sheet metal-made retaining members 53, 54 and 57 are inserted and assembled has been assembled into the board 51.

The positional relationship between the discharge gap element 304 and the board in the first embodiment will be described with reference to FIG. 12.

Figure 12:
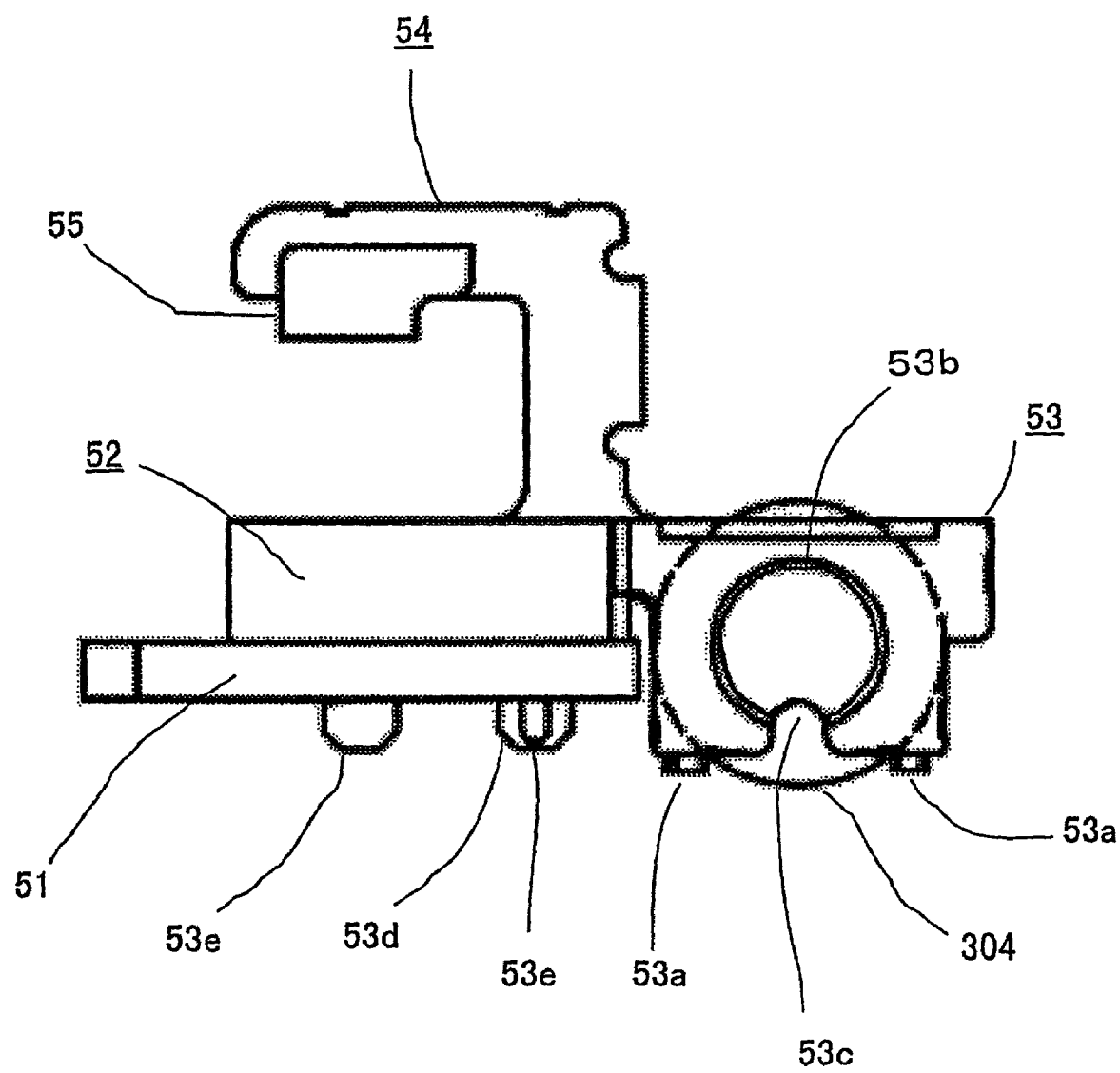
FIG. 12 is a side view showing a state in which the discharge gap element of an ignitor-integrated type socket is mounted in a first embodiment.

Referring to FIG. 12, reference numeral 51 denotes the board, reference numeral 52 the resin holder, reference numerals 53 and 54 the pair of sheet metal-made retaining members, and reference numeral 304 the discharge gap element. As shown in FIG. 12, the lowermost surface of the discharge gap element 304 is arranged lower than the back of the board 51. When the back (lower surface) of the board is subjected to line-flow soldering, the electrodes of the discharge gap element 304 are exposed at the notched portions 53c and 54c of the pair of sheet metal-made retaining members 53 and 54. In addition, the exposed portions are positioned below the board and so they surely come into contact with the solder layer. Further, the presence of the notched portions introduces the solder upward above the upper surface of the solder pond. As a result, the secure and steady soldering remarkably improves the reliability of the soldered portions.

As features of the first embodiment thus configured as above, the following points are listed.

1) Since the pair of sheet metal-made retaining members 53 and 54 extend laterally from above the board, and since the position for holding the discharge gap element 304 protrudes from the board 51, the discharge gap element is held at the position protruded laterally from the board. As a result, the space is effectively used, so that a limitation is placed on height.

2) Since the pair of sheet metal-made retaining members 53 and 54 are provided with the pair of claws 53a and 54a for retaining the discharge gap element 304, the discharge gap element is held at the predetermined position, owing to the provision of the claws for holding the discharge gap element.

3) Since the pair of the sheet metal-made retaining members 53 and 54 are provided with convexities 53b and 54b to make sure of contact with the electrodes of the discharge gap element 304, and since the electrodes are supported by the convexities, the electrodes on both ends of the discharge gap element are urged and held with an appropriate force through the convexities provided in the sheet metal-made retaining portions of the sheet metal-made discharge gap element. Even at the stage before the soldering, this prevents displacement and fall off of the discharge gap element, and steadily solders the electrodes in the soldering process.

4) Since notches 53c and 54c reaching the convexities 53b and 54b are formed in the sheet metal-made retaining members 53 and 54 on the lower surface for tightly holding the discharge gap element therein, the electrodes of the discharge gap element are partly exposed at the notched portions formed in the sheet metal-made retaining members. This improves the finishing quality of solder wetting (or wicking) from the solder bath at the time of soldering process.

5) Since the claws 53a and 54a of the sheet metal-made retaining members 53 and 54 are arranged lower than the back of the board, and since the lowermost surface of the discharge gap element 304 in the held state is arranged below the back of the board, when the discharge gap element passes through the line-flow solder bath, the solder caused to be adhered securely. This guarantees more secure solder processing of the discharge gap element.

6) Since one of the sheet metal-made retaining members is provided with a groove for winding the primary coil and the secondary coil therearound and pouring the solder thereinto, and since the groove is formed by bending the sheet metal, the coil wiring work is simplified, owing to the provision of the groove for winding the primary coil and the secondary coil with the sheet metal-made retaining members. In addition, by pouring the solder into the groove, the coil twisted and wound portion is fixed surely.

7) Since, as pull-out arresting means, when the sheet metal-made retaining members are assembled into the resin holder, the embossed portions are formed, the sheet metal-made retaining member are prevented from being fallen off from the resin holder after insertion, owing to the provision of the pull-out arresting means in the inserting portion of each of the sheet metal-made retaining members to be inserted into the resin holder.

8) Since inclination preventing means for preventing the board from inclining at the step of twisting the primary coil and the secondary coil after each part has been mounted on the board, unwilling falling down of the board is prevented even at the coil twisting step, owing to the provision of the inclination preventing means for preventing the board from being lifted or inclined resulted from the coil tension at the step of coil twisting after having mounted the necessary parts on the board.

9) Since catch preventing means for preventing the discharge gap element from being caught at the time of inserting and assembling the discharge gap element into the sheet metal-made retaining members, the assembly work of the discharge gap element is done more stably and the loss time at assembling due to catch or the like is saved, owing to the provision of the catch preventing means for preventing the discharge gap element from being caught at the time of inserting and assembling the discharge gap element into the space between the sheet metal-made retaining members.

Second Embodiment

Figure 13:
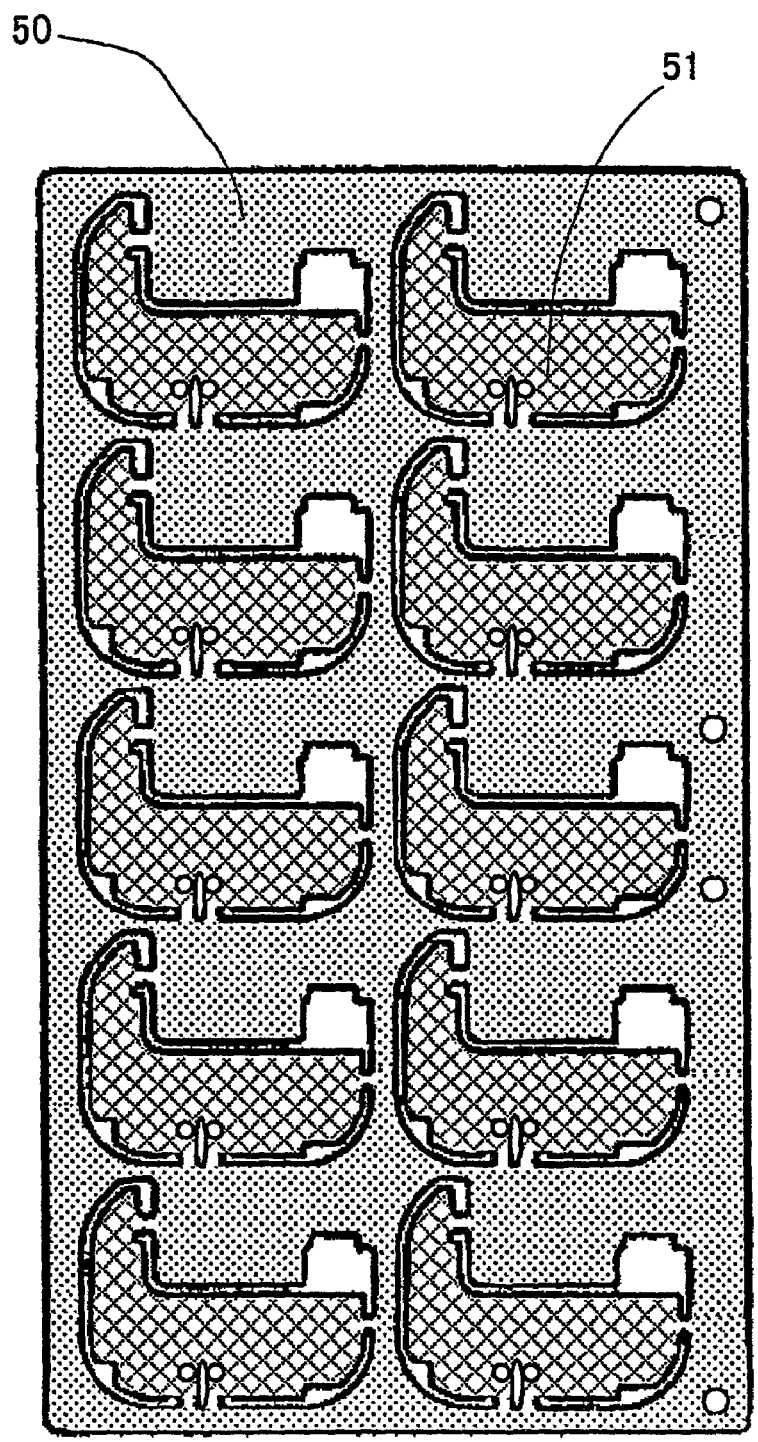
FIG. 13 is a plan view showing a board for a starting circuit of an ignitor-integrated type socket in a second embodiment of the invention.
Figure 14:
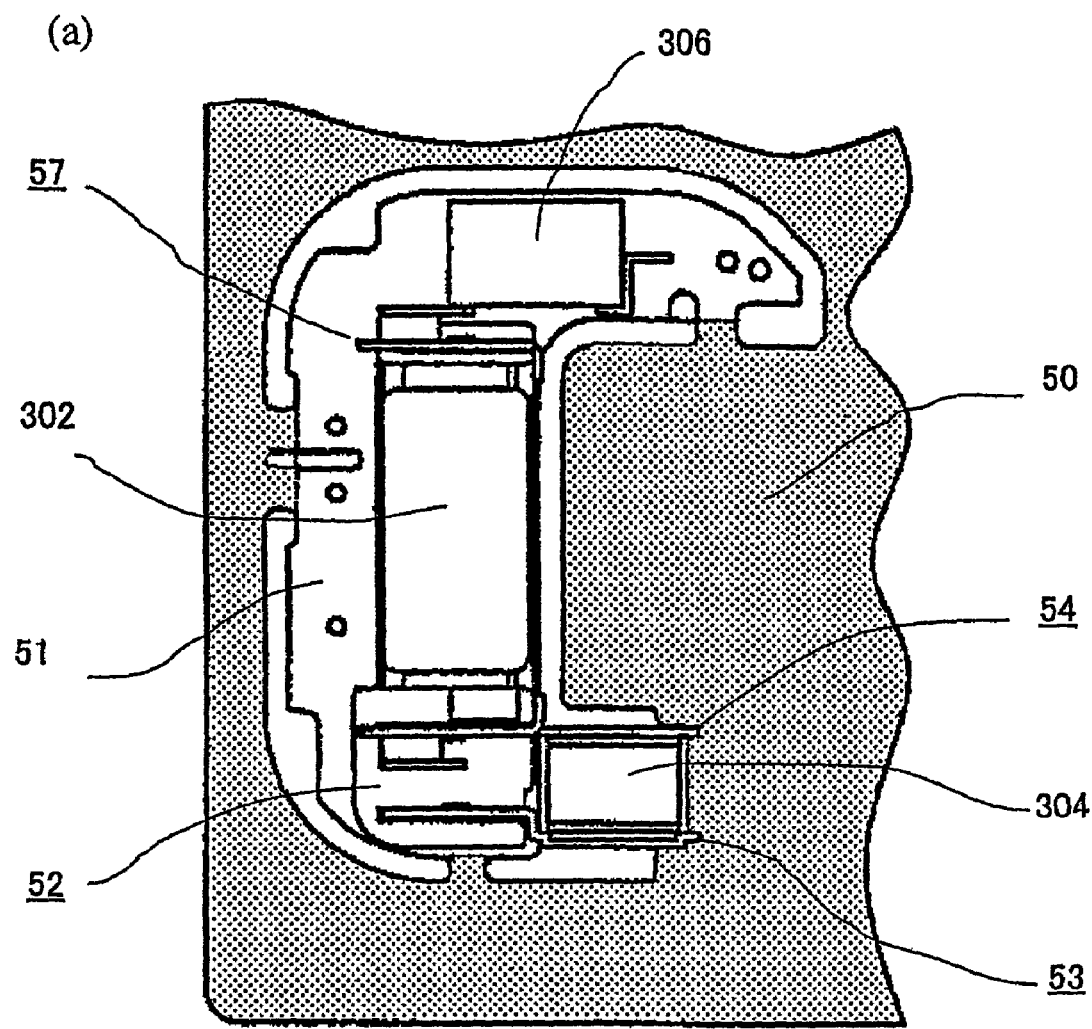
FIG. 14a and FIG. 14b is a partial plan view and a side view showing a state in which each part is mounted on the board for starting circuit of an ignitor-integrated type bulb socket in a second embodiment.
Figure 14:
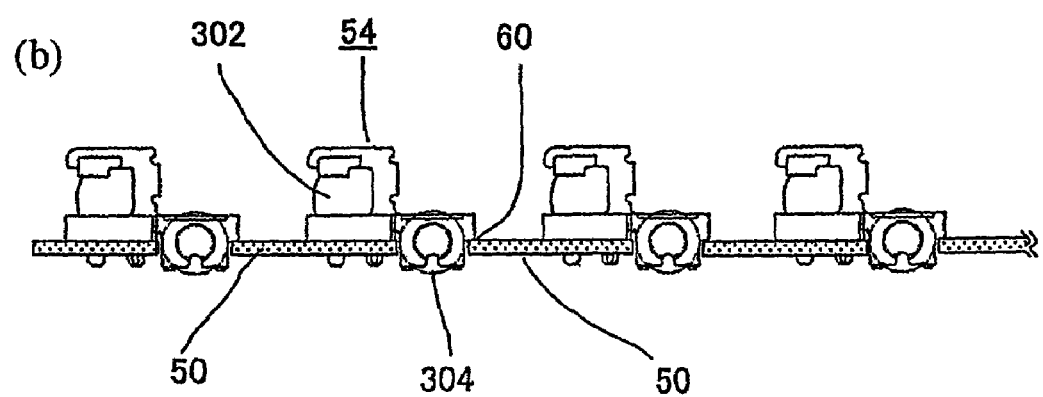

FIGS. 13 and 14 show the board explaining the method of assembling the starting circuit in the ignitor-integrated integrated type bulb socket of the second embodiment of the invention.

Referring to FIGS. 13, 14, reference numeral 50 denotes a waste board, and reference numeral 51 a board for the starting circuit 300, which show an exemplary board shape for 10 parts.

FIG. 14A shows the state, as seen from the just above, in which respective parts have been arranged on a board for a plurality of parts. FIG. 14B shows the state, as seen from the side, in which respective parts have been arranged on the board for a plurality of parts.

Referring to FIGS. 14A, 14B, reference numeral 50 denotes a waste board, reference numeral 51 a board for the starting circuit 300, reference numeral 52 a resin holder, reference numerals 53 and 54 a pair of sheet metal-made retaining members, reference numeral 57 another sheet metal-made retaining member, reference numeral 302 a capacitor, reference numeral 304 a discharge gap element, and reference numeral 306 a capacitor for noises reduction.

In a state in which the respective parts have been assembled on the board for a plurality of parts, ends of the pair of sheet metal-made retaining members 53, 54 on the side where the discharge gap element 304 is supported are supported by the waste board, and the position and the width are restricted on the waste board. For example, as shown in FIG. 14A, in order to prevent the space between the sheet metal-made retaining members 53, 54 from getting widen as a result of insertion of the discharge gap element 304 into the space between the sheet metal-made retaining members 53, 54, the restriction in the widthwise direction is put on the waste board. Further, as shown in FIG. 14B, since the lower surfaces of the front ends 60 of the sheet metal-made retaining members 53, 54 are laid down on the board, the sheet metal-made retaining members are prevented from inclining by the inserting force at the time of assembling the discharge gap element 304.

Having been taken such an arrangement, the inserting force at the time of assembling the discharge gap element prevents dislocation, widening, and falling down, or the like, resulting in a remarkable improvement in the stability of the products.

Hereinabove, each of the embodiments has been described, each embodiment having the following features.

As one of the features of each embodiment, the following is listed.

In an ignitor-integrated type bulb socket comprising a transformer made up of a core of high magnetic permeability which is inserted into the central hole of the resin bobbin around which a primary coil and a secondary coil are wound, and a high-voltage terminal which is inserted substantially into the center of the bobbin and is connected to the secondary coil for applying a high voltage to a high-voltage plug of the lamp; a low-voltage terminal which is inserted into the outside of the bobbin and is connected to a low-voltage plug of the lamp; a board mounted thereon a power supply control circuit for controlling generation of a high voltage; and the lower case and the upper case for housing the above, a leadless discharge gap element assembled into the control circuit is used, and the discharge gap element is held and fixed by sheet metal-made retaining members mounted on the board. Through this arrangement, since the leadless discharge gap element assembled into the stating circuit is used, and the discharge gap element is held and fixed by the sheet metal-made retaining members mounted on the board, and since both electrodes of the discharge gap element are held and fixed by the sheet metal-made retaining members, the leads of the discharge gap element may be eliminated. This not only lowers the height from the board surface, but also improves the mounting capability on the board, enhancing productivity.

As another feature, the following is listed.

Provision of the board with a resin holder for fixing and holding the sheet metal-made retaining members onto the board prevents the falling down and dislocation on the board which is disadvantages arose from the fact that the retaining members are made of sheet metal. This accelerates the stability in mounting. Further, since it is possible to make the holder into a shape in which the capacitor is held by using a resin of high insulating characteristics, both the sheet metal-made retaining members and the capacitor are prevented from falling down, dislocating, or coming into contact with adjacent parts.

As another feature, the following is listed.

Holding and fixing the discharge gap element by sheet metal-made retaining members extended laterally and protruded from the board removes the restriction that the discharge gap element has to be mounted on the board surface alone, and gives an opportunity to utilize the space other than the board surface with the minimum board area. This largely raises the limitation placed on parts layout.

As still another feature, the following is listed.

By holding, with a waste board, side ends of the sheet metal-made retaining members protruded laterally from the board, the ends of the sheet metal-made retaining member which retains the discharge gap element are supported by the waste board side at the position protruded from the board surface. This surely prevents dislocation of the sheet metal-made retaining member and the discharge gap element due to the vibrations or unexpected external forces or the like when processing the flow-solder to solder, e.g., a terminal of various electronic parts mounted on the board for a plurality of parts by only one step at the same time.

As another feature, the following is listed.

Since the portions for holding the discharge gap element of the sheet metal-made retaining members are provided with holding claws for holding the discharge gap element, at the time an ordinary cylindrical discharge gap element is mounted on the retaining members, the cylindrical body is supported by the pair of the holding claws. This securely holds the discharge gap element in the predetermined position of the retaining members.

As still another feature, the following is listed.

Since the mounting board is provided with a pair of sheet metal-made retaining members for tightly holding the discharge gap element, and since the portions for holding the discharge gap element of the sheet metal-made retaining members are provided with a concavity or a convexity so that the discharge gap element is held, by the elastic force of the sheet metal-made retaining members, after insertion, the concavity or the convexity of the retaining members get engaged with the electrodes on both sides of the discharge gap element and, thanks to the elastic force of the sheet plate metal retaining members themselves, the discharge gap element can be urged by the predetermined force from the both electrodes.

Since both electrodes of an ordinary discharge gap element has a concaved shape, it is preferable to provide the sheet plate metal retaining members with concavity.

As still another feature, the following is listed.

In an ignitor-integrated type bulb socket comprising a transformer made up of a core of high magnetic permeability, which is inserted into the central hole of the resin bobbin around which a primary coil and a secondary coil are wound, and a high-voltage terminal which is inserted substantially into the center of the bobbin and is connected to the secondary coil for applying a high voltage to a high-voltage plug of the lamp; a low-voltage terminal which is inserted into the outside of the bobbin and is connected to a low-voltage plug of the lamp; a board mounted thereon a power supply control circuit for controlling generation of a high voltage; and the lower case and the upper case for housing the above, a part of the discharge gap element is protruded below the lower surface the board. It becomes possible even for the leadless discharge gap element to be subjected to the flow-solder processing together with each of the terminal of the electronic parts disposed on the upper surface of the board, owing to a part of the electrodes on both sides of the discharge gap element are partly exposed to the lower surface of the board. Further, since the height of the portion of the discharge gap element protruded over the board can be made lower, higher freedom of design is given to thinning of the apparatus.

As still further feature, the following is listed.

Since there is provided, in the lower side of the discharge gap element retaining portion of the sheet metal-made retaining members, a notched portion to improve the wetting of the solder, with the discharge gap element held by the sheet metal-made the retaining members, when a line-flow soldering is performed, the flow-solder adhered to the notched portion in the sheet metal-made retaining members. As a result, the solder is surely introduced to the electrodes of the discharge gap element. This further enhances the reliability of the soldered portions.

As still another feature, the following is listed.

Since the sheet metal-made retaining members are made of a tin-plated steel plate or a galvanized steel plate, the solder adhesion to the sheet metal-made retaining members is remarkably improved. In addition, since the electrodes of the discharge gap element and the sheet metal-made retaining members can surely be bound by soldering, further improving the reliability of the soldered portions.

As still another feature, the following is listed.

Since the pair of sheet metal-made retaining members have the functions of holding and fixing the discharge gap element, and since at least one of the sheet metal-made retaining members also has the functions of twisting and connecting, and fixing the low-voltage ends of the primary coil and the secondary coil, the distal ends of the primary coil and the secondary coil can be directly twisted and wound around the sheet metal-made retaining members, thus requiring no special harness.

As still further feature, the following is listed.

Since the portions around which the distal ends of the primary coil and the secondary coil are twisted and wound are provided with sheet metal-made retaining members bent in groove-like shape, it is possible to pour solder into the groove after the primary coil and the secondary coil have been twisted and wound around the portions bent in groove-like shape of the sheet metal-made retaining members. This remarkably improves the reliability of the soldered connecting portions of the both coils.

INDUSTRIAL APPLICABILITY

As described above, the mounting board, the method of mounting the mounting board, and the bulb socket using the mounting board according to the invention are applied to a mounting board on which various parts are mounted, a method of mounting the parts on the mounting board and a bulb socket for a discharge lamp using the mounting board on which various parts are mounted, the discharge lamp being used for a lighting device of a vehicle-mounted discharge lamp, or the like.

The invention claimed is:

1. A mounting board, comprising:
   a board;
   a retaining member mounted on an upper surface of said board; and
   a part retained by said retaining member;
   wherein at least a portion of said part is arranged below a lower surface of said board, and wherein said part is electrically connected to said board through said retaining member.

2. The mounting board according to claim 1, wherein said retaining member comprises:
   a holder mounted on said board; and
   a retaining portion, projected laterally from said holder, for holding said part.

3. The mounting board according to claim 1, wherein said retaining member is retained by a waste board.

4. The mounting board according to claim 1, wherein the retaining member only contacts the upper surface of said board.

5. The mounting board according to claim 1, wherein the part is electrically connected to the upper surface of said board through said retaining member.

6. The mounting board according to claim 1, wherein the part is retained by said retaining member along an outer peripheral edge of the board.

7. A mounting board, comprising:
   a retaining member mounted on a board; and
   a leadless discharge gap element retained by said retaining member;
   wherein said discharge gap element is arranged below the lower surface of said board, and wherein said discharge gap element is electrically connected to said board through said retaining member.

8. The mounting board according to claim 7, wherein the retaining member only contacts an upper surface of said board.

9. The mounting board according to claim 7, wherein the discharge gap element is electrically connected to an upper surface of said board through said retaining member.

10. The mounting board according to claim 7, wherein the discharge gap element is retained by said retaining member along an outer peripheral edge of the board.

11. A method of mounting a mounting board, comprising the steps of:

holding a retaining member which retains a part by a board and a waste board;

retaining said part by said retaining member;

fixing said retaining member on said board; and removing said waste board from said board after said retaining member has been fixed on said board.

12. The method of mounting a mounting board according to claim 11, wherein said step of fixing said retaining member on said board is a step of soldering said retaining member to said board and said part to said retaining member.

13. A mounting board, comprising:

a board;

a retaining member mounted on an upper surface of said board; and an electrical part retained apart from said board by said retaining member;

wherein portions of said electrical part are arranged both above and below a lower surface of said board, and wherein said part is electrically connected to said board through said retaining member.

14. The mounting board according to claim 13, wherein said retaining member comprises:

a holding portion mounted on said board; and a retaining portion, projected laterally from said holding portion and holding said electrical part at a distal end.

15. The mounting board according to claim 14, wherein said holding portion comprises legs which extend from said holding portion through said board so as to provide electrical connections on the lower surface of said board.

16. The mounting board according to claim 14, wherein said retaining portion further comprises a claw, formed on a lower portion of said retaining portion, which supports said electrical part.

17. The mounting board according to claim 14, wherein said retaining portion further comprises a convexity, formed to provide electrical contact between said retaining portion and said electrical part.

18. The mounting board according to claim 17, wherein said resin holder is a box-like structure formed with a slit perpendicular to the upper surface of said board, and a portion of said retaining member is a plate-like structure that fits within said slit.

19. The mounting board according to claim 14, wherein said retaining member further comprises a coil connecting part having grooves around which distal ends of a primary coil and a secondary coil of a transformer are wound and soldered.

20. The mounting board according to claim 13, said mounting board further comprising a resin holder connected to said board and said retaining member to locate and support said retaining member on said board.

21. The mounting board according to claim 20, wherein said plate-like portion of said retaining member further comprises embossments in a direction perpendicular to its surface, wherein said embossments help to secure said retaining member within said slit.

22. The mounting board according to claim 13, wherein said electrical part is a discharge gap element.

23. The mounting board according to claim 13, wherein said retaining member is made of sheet metal.

24. The mounting board according to claim 13, wherein said board is planar.

25. The mounting board according to claim 13, wherein the retaining member only contacts the upper surface of said board.

26. The mounting board according to claim 13, wherein the part is electrically connected to the upper surface of said board through said retaining member.

27. The mounting board according to claim 13, wherein the part is retained by said retaining member along an outer peripheral edge of the board.

28. The mounting board according to claim 13, wherein said part is a discharge gap element.

* * * * *